United States Patent
Akiyama

[11] Patent Number: 5,855,689
[45] Date of Patent: Jan. 5, 1999

[54] METHOD FOR ETCHING INSIDE OF TUNGSTEN CVD REACTION ROOM

[75] Inventor: Takao Akiyama, Tokyo, Japan

[73] Assignee: NEC Corporation, Tokyo, Japan

[21] Appl. No.: 800,992

[22] Filed: Feb. 21, 1997

[30] Foreign Application Priority Data

Feb. 21, 1996 [JP] Japan ................................. 8-033878

[51] Int. Cl.$^6$ ................................. B08B 6/00; B44C 1/22
[52] U.S. Cl. ................................. 134/1.1; 216/67; 216/75
[58] Field of Search ................................. 134/1.1; 216/67, 216/75

[56] References Cited

U.S. PATENT DOCUMENTS

| | | | |
|---|---|---|---|
| 4,529,474 | 7/1985 | Fujiyama et al. | 156/643 |
| 4,623,417 | 11/1986 | Spencer et al. | 156/345 |
| 5,209,836 | 5/1993 | Chang | 134/1 |
| 5,260,236 | 11/1993 | Petro et al. | 156/643 |
| 5,527,417 | 6/1996 | Iida et al. | 156/345 |

FOREIGN PATENT DOCUMENTS

| | | |
|---|---|---|
| 0464696 | 1/1992 | European Pat. Off. . |
| 0574075 | 12/1993 | European Pat. Off. . |
| 0697467 | 2/1996 | European Pat. Off. . |
| 59-070763 | 4/1984 | Japan . |
| 1-130529 | 5/1989 | Japan . |
| 4-243121 | 8/1992 | Japan . |
| 6-258859 | 2/1994 | Japan . |
| 08085885 | 4/1996 | Japan . |

OTHER PUBLICATIONS

"Selective Reactive Ion Etching of Tungsten Films in Fluorinated Gasses", Pan et al.; Abstract Only; 1987; Report: Gov. Rep. Announce, Index (U.S.), 87(22), Abstract, No. 751,096.

08–085885 Hitaoki et al., "Method for Cleaning Microwave Plasma Device", Patent Abstracts of Japan (1996) *Abstract*.

*Primary Examiner*—Benjamin Utech
*Assistant Examiner*—George Goudreau
*Attorney, Agent, or Firm*—Foley & Lardner

[57] ABSTRACT

Disclosed is a method for etching the inside of a tungsten CVD reaction room, in which tungsten deposited on the inside of the reaction room by a film-forming gas when a tungsten CVD reaction is conducted is removed by plasma, and which has the steps of: exhausting a remainder of the film-forming gas in the reaction room; and then supplying a high-frequency electric power into the reaction room while keeping a predetermined degree of vacuum in the reaction room and leading a mixing gas of sulfur hexafluoride and oxygen into the reaction room to generate the plasma.

3 Claims, 2 Drawing Sheets

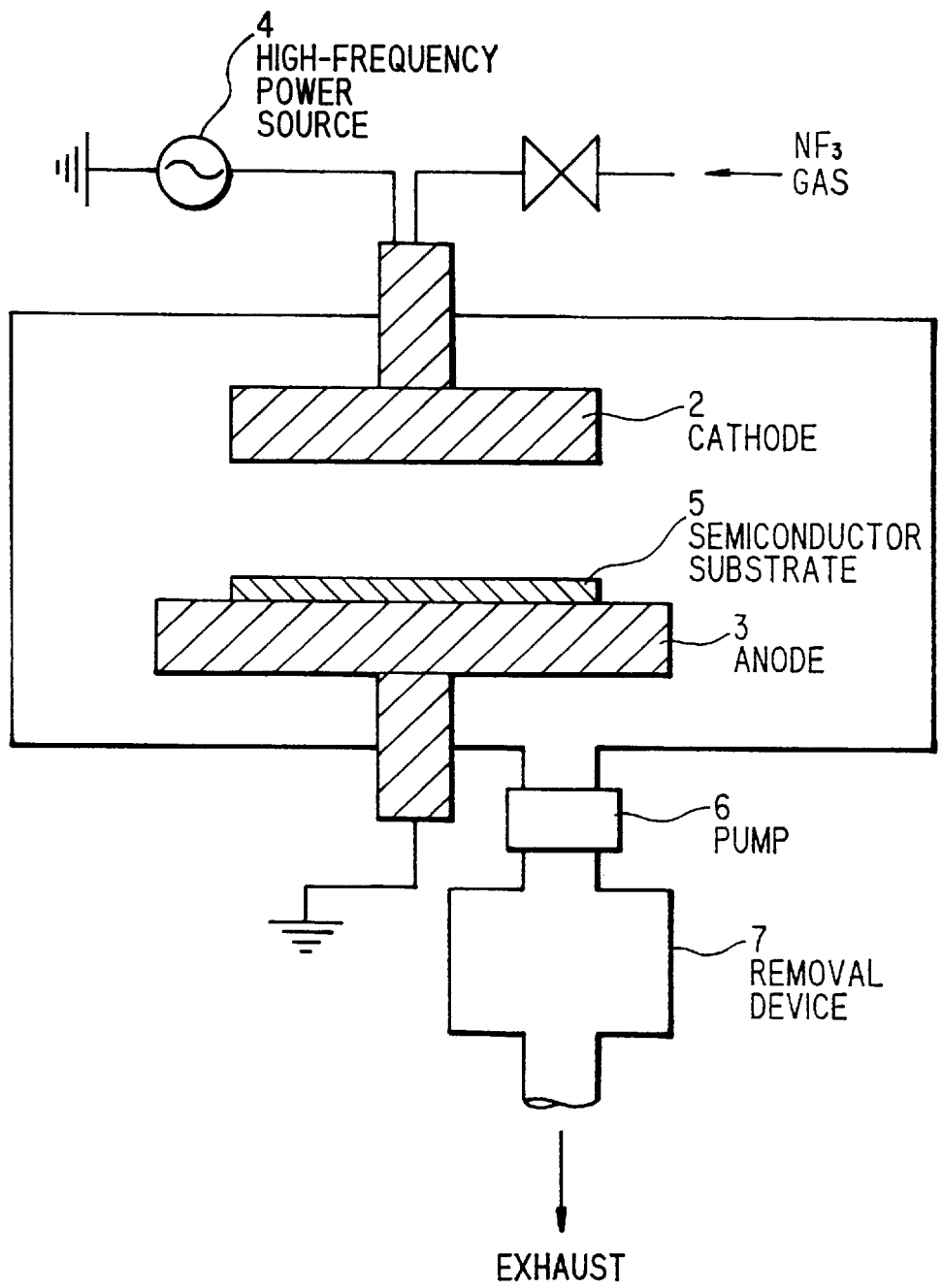

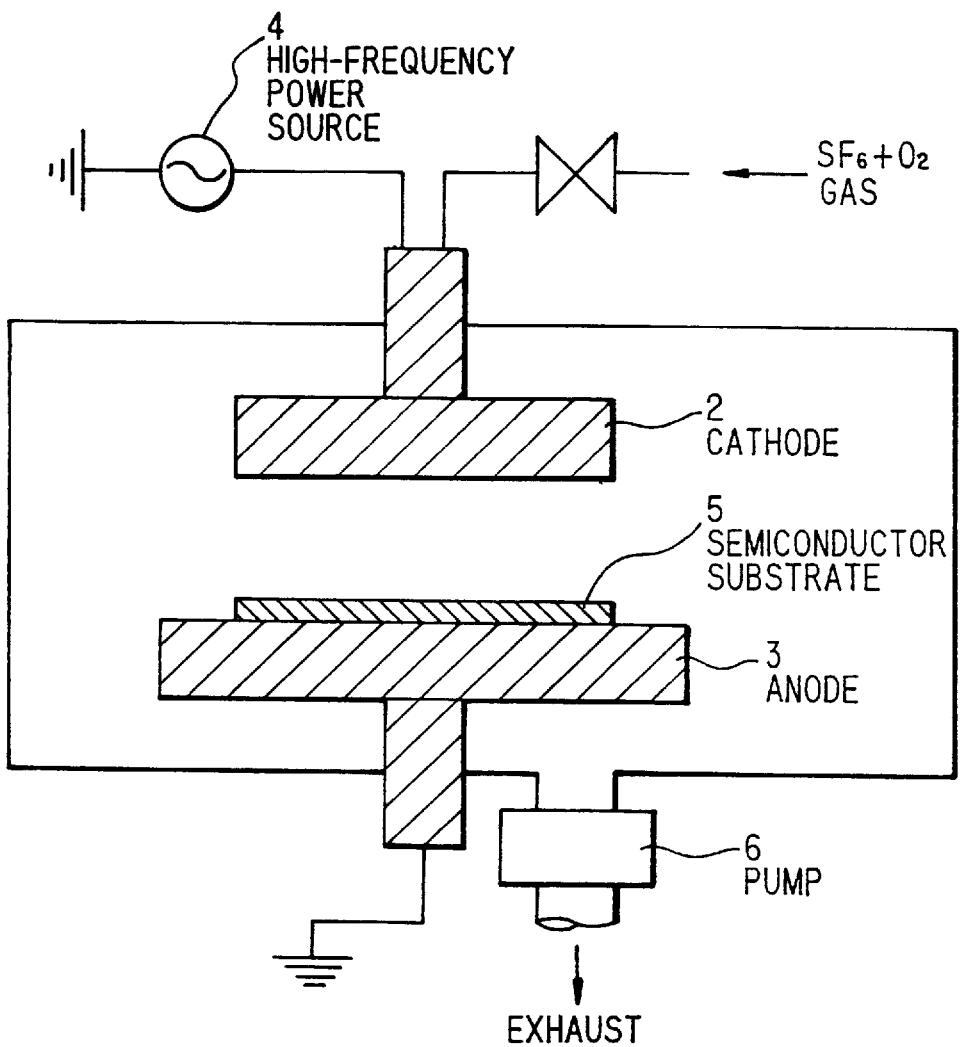

METHOD FOR ETCHING INSIDE OF TUNGSTEN CVD REACTION ROOM

FIELD OF THE INVENTION

This invention relates to a method for etching the inside of a tungsten CVD reaction room, and more particularly to, a method for etching the inside of a tungsten CVD reaction room by using plasma etching.

BACKGROUND OF THE INVENTION

In a conventional method for fabricating a semiconductor device, an electrically conducting hole, i.e., a contact needs to be provided at a predetermined position. As a conductive material, aluminum(Al) which is supplied by sputtering has been used for a long time. However, along with recent high-integration of semiconductor device, a diameter of contact reaches a level of sub-micron and the aspect ratio(a ratio of height and width) increases, thereby deteriorating a step coverage in the aluminum contact and causing a short circuit.

To solve this problem, a method has been developed in which tungsten is buried into a contact before sputtering. For example, tungsten film is first formed on a semiconductor substrate by using the CVD method, thereafter etching back the entire surface of the tungsten film by dry etching. At this time, the tungsten film on the surface of the substrate can be removed, but tungsten buried into the contact remains. Then, aluminum is sputtered to contact the tungsten in the contact, thereby forming an electric conduction therebetween. In this method, the process of tungsten CVD will be explained referring to FIG. 1.

FIG. 1 is a schematic diagram showing a conventional tungsten CVD device. As shown, in a reaction room 1 which is made of metal, a cathode 2 and an anode 3 are disposed opposite to each other, where the bottom part of the cathode 2 has many small holes that function as inlets leading gas. Furthermore, the cathode 2 is connected to a high-frequency power source 4, and the anode 3 also functions as a ground. To the exhaust of the reaction room 1, a removal device 7 as to nitrogen trifluoride(NF3) is connected through a pump 6.

In operation, a semiconductor substrate 5 is disposed on the anode 3, then flowing a gas such as tungsten hexafluoride(WF6) of 200 to 400 sccm from the gas inlets the into the reaction room 1 while generating a high frequency of 13.56 MHz at 100 to 300 W from the high-frequency power source 4. Then, by adjusting the inner pressure of the reaction room to be about 0.5 to 0.7 Torr by controlling the amount of exhaust gas and raising the temperature of the anode 3 at 300° to 500° C., tungsten film can be formed on the semiconductor substrate 5.

The tungsten film is also formed on the inside wall of the reaction room 1, the surface of the cathode 2 and the surface of the anode 3 except the surface where the semiconductor substrate 5 is disposed, and the deposition thickness is gradually increased with the progress of deposition. Since the deposition film of tungsten on the inside wall of the reaction room 1 etc. causes particles released from there as the film thickness is increased, they should be removed.

This removal is conducted after the tungsten film is formed on the semiconductor substrate 5 and the semiconductor substrate 5 is taken out from the reaction room 1. After taking out the substrate 5, the reaction room 1 is vacuumed to exhaust the remainder of WF6 gas used in the deposition of tungsten film, thereafter leading a fluoride gas such as nitrogen trifluoride(NF3) of 100 to 200 sccm into the reaction room 1, then generating a high frequency of, for example, 13.56 MHz at 300 to 500 W while holding the degree of vacuum of the reaction room 1 to be, for example, 100 to 150 mm Torr.

The time required in this removal treatment is determined by the thickness of the tungsten film attached to the inside of the reaction room 1. For example, if the deposition of 500 nm film is once conducted, the removal treatment on the above condition takes about 2 min. and 30 sec. Such etching treatment can be conducted after the tungsten CVD of the semiconductor substrate 5, thereby removing the tungsten film attached to the inside of the reaction room 1 etc. to prevent the particles from releasing. The etching reaction is progressed as shown by:

$$W + 2NF_3 \rightarrow WF_6 + N_2 \tag{1}$$

On the other hand, the NF3 remainder gas which is not reacted with W is exhausted through the pump 6 into the removal device 7, where it is treated to exhaust only nitrogen(N2). The removal device 7 contains a material for adsorbing fluorine which is changed once about three to six months. Thus, the NF3 gas which is harmful can be prevented from directly exhausting into the air. WF6 obtained by the above reaction (1) is diluted by a sufficient N2, thereafter released into the air, therefore causing no problem in safety.

However, since NF3 used in the plasma etching to the reaction room 1 is an earth-warming-substance, it may be prohibited in the future. Furthermore, there is a problem that the removal device for treating the harmful NF3 gas is costly.

SUMMARY OF THE INVENTION

Accordingly, it is an object of the invention to provide a a method for etching the inside of a tungsten CVD reaction room in which a device for removing a harmful gas is not necessary.

According to the invention, a method for etching the inside of a tungsten CVD reaction room, in which tungsten deposited on the inside of the reaction room by a film-forming gas when a tungsten CVD reaction is conducted is removed by plasma, comprises the steps of:

exhausting a remainder of the film-forming gas in the reaction room; and then supplying a high-frequency electric power into the reaction room while keeping a predetermined degree of vacuum in the reaction room and leading a mixing gas of sulfur hexafluoride and oxygen into the reaction room to generate the plasma According to another aspect of the invention, a method for etching the inside of a tungsten CVD reaction room, in which tungsten deposited on the inside of the reaction room by a film-forming gas when a tungsten CVD reaction is conducted is removed by plasma, comprises the steps of:

exhausting a remainder of the film-forming gas in the reaction room;

then supplying a first high-frequency electric power into the reaction room while keeping a first predetermined degree of vacuum in the reaction room and leading a mixing gas of sulfur hexafluoride and oxygen into the reaction room to generate the plasma; and then supplying a second high-frequency electric power into the reaction room while keeping a second predetermined degree of vacuum in the reaction room and leading the mixing gas into the reaction room to generate the plasma.

BRIEF DESCRIPTION OF THE DRAWINGS

The invention will be explained in more detail in conjunction with the appended drawings, wherein:

FIG. 1 is a schematic diagram showing a tungsten CVD growth device used in a conventional etching method, and FIG. 2 is a schematic diagram showing a tungsten CVD growth device used in preferred embodiments according to invention.

DESCRIPTION OF THE PREFERRED EMBODIMENTS

A method for etching the inside of a tungsten CVD reaction room in a first preferred embodiment will be explained in FIG. 2, wherein like parts are indicated by like reference numerals as used in FIG. 1. The composition of the tungsten CVD device used in the first embodiment is similar to that of the conventional tungsten CVD device. As shown in FIG. 2, in a reaction room 1 which is made of metal, a cathode 2 and an anode 3 are disposed opposite to each other, where the bottom part of the cathode 2 has many small holes that function as inlets leading gas. Furthermore, the cathode 2 is connected to a high-frequency power source 4, and the anode 3 also functions as a ground. To the exhaust side of the reaction room 1, a pump 6 is connected, but, different from the conventional device, the removal device 7 is not connected to the exhaust side of the pump 6.

In operation, a semiconductor substrate 5 is disposed on the anode 3, then flowing a gas such as tungsten hexafluoride(WF6) of 200 to 400 sccm from the gas inlets the into the reaction room 1 while generating a high frequency of 13.56 MHz at 100 to 300 W from the high-frequency power source 4. Then, by adjusting the inner pressure of the reaction room to be about 0.5 to 0.7 Torr by controlling the amount of exhaust gas and raising the temperature of the anode 3 at 300° to 500° C., tungsten film can be formed on the semiconductor substrate 5. At this time, as explained before, the tungsten film is also formed on the inside wall of the reaction room 1, the surface of the cathode 2 and the surface of the anode 3 except the surface where the semiconductor substrate 5 is disposed, thereby causing particles released from there.

The removal of the tungsten deposited on the inside of the reaction room 1 is conducted after the tungsten film is formed on the semiconductor substrate 5 and the semiconductor substrate 5 is taken out from the reaction room 1. After taking out the substrate 5, the reaction room 1 is vacuumed to exhaust the remainder of WF6 gas used in the deposition of tungsten film, thereafter leading a mixing gas of sulfur hexafluoride(SF6) and oxygen(O2), which are flown at, for example, 60 to 70 sccm of SF6 and 5 to 10 sccm of oxygen, from the gas inlets into the reaction room, then generating a high frequency of, for example, 13.56 MHz at 400 to 500 W while holding the degree of vacuum of the reaction room 1 to be, for example, 50 to 70 mm Torr. The time required in this removal treatment on the above condition is, for example, in case of WCVD of 500 nm film is once conducted, is about 2 min. The etching reaction in the reaction room 1 is progressed as shown by:

$$W+SF6+O2 \rightarrow WF6+SO2 \qquad (2)$$

In this case, the exhaust gas from the reaction room 1 is diluted by a sufficient N2, thereafter released into the air. Therefore, the removal device 7 needed in the conventional method is not necessary. After completing the etching treatment, the reaction room 1 is again vacuumed, then the next semiconductor substrate 5 is disposed on the anode 3 to start WCVD.

After repeating 1000 times of the film deposition and etching according to the above-mentioned method as to the WCVD growth of 500 nm film, no particle occurs, thereby it is proved that the etching is well conducted.

A method for etching the inside of a tungsten CVD reaction room in a second preferred embodiment will be explained below.

As compared with the first embodiment, in which the etching of the inside of the reaction room 1 is conducted by using one step, the second embodiment is the etching is conducted by using two steps with different conditions.

In operation, similarly to the first embodiment, after completing the deposition of WCVD film and taking out the substrate from the reaction room 1, the reaction room 1 is vacuumed to exhaust the remainder of WF6 gas used in the deposition of tungsten film, thereafter leading a mixing gas of sulfur hexafluoride(SF6) and oxygen(O2), which are flown at, for example, 60 to 70 sccm of SF6 and 5 to 10 sccm of oxygen, from the gas inlets into the reaction room, then generating a high frequency of, for example, 13.56 MHz at 400 to 500 W while holding the degree of vacuum of the reaction room 1 to be, for example, 50 to 70 mm Torr. The time required in this removal treatment on the above condition is, for example, in case of WCVD of 500 nm film is once conducted, is about 2 min.

In the second embodiment, after completing the above (first) etching step, the second etching step with a different condition is conducted. Employed in the second step are a pressure of 70 to 100 mm Torr which is higher than that in the first step and a high-frequency output power of 200 to 300 W at 13.56 MHz. The second etching is conducted on the above condition for about 30 sec.

In the second embodiment, the first fetching step is mainly effective to the cathode 2 and the anode 3, i.e., the etching to the inside wall of the reaction room 1 is not sufficient. This is because plasma generated is concentrated around the electrodes due to the low-pressure and high-power etching condition. On the contrary, since the second etching step is conducted under the condition with the higher pressure and lower power, the plasma spatters the entire of the reaction room 1, therefore the inside of the reaction room 1 being efficiently etched.

After completing the second etching step, similarly to the first embodiment, the reaction room 1 is again vacuumed, then the next semiconductor substrate 5 is disposed on the anode 3 to start WCVD. In the second embodiment, even after repeating 3000 times of the WCVD growth of 500 nm film, no particle occurs. In the second embodiment, though the treatment time per one semiconductor substrate becomes long, the degree of cleanness can be kept for a period two times longer than that in the first embodiment. Therefore, the productivity is equal to that in the first embodiment.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for etching the inside of a tungsten CVD reaction room, in which tungsten deposited on the inside of said reaction room by a film-forming gas when a tungsten CVD reaction is conducted is removed by plasma, comprising the steps of:

exhausting a remainder of said film-forming gas in said reaction room;

leading a first mixing gas of sulfur hexafluoride and oxygen into said reaction room to generate a first vacuum degree;

supplying a first high-frequency electric power into said reaction room to generate said plasma cooperatively with said first mixing gas;

leading a second mixing gas of sulfur hexafluoride and oxygen into said reaction room to generate a second vacuum degree which is different from said first vacuum degree; and supplying a second high-frequency electric power into said reaction room to generate said plasma cooperatively with said second mixing gas.

2. A method for etching the inside of a tungsten CVD reaction room, according to claim 1, wherein:

said first high-frequency electric power is higher than said second high-frequency electric power, and said first vacuum degree is lower than said second vacuum degree.

3. A method for etching the inside of a tungsten CVD reaction room, according to claim 2, wherein:

said first vacuum degree is less than 70 mm Torr and said second vacuum decree is higher than 70 mm Torr.

* * * * *